(12) United States Patent
Fujino

(10) Patent No.: US 7,911,282 B2
(45) Date of Patent: Mar. 22, 2011

(54) VOLTAGE-CONTROLLED OSCILLATOR INCLUDING PLURALITY OF DELAY CELLS

(75) Inventor: Satoshi Fujino, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 3 days.

(21) Appl. No.: 12/385,353

(22) Filed: Apr. 6, 2009

(65) Prior Publication Data

US 2009/0261909 A1    Oct. 22, 2009

(30) Foreign Application Priority Data

Apr. 16, 2008    (JP) ................................ 2008-106638

(51) Int. Cl.
*H03K 3/03*    (2006.01)

(52) U.S. Cl. ........................ 331/57; 331/177 R; 331/185

(58) Field of Classification Search ..................... 331/57, 331/177 R, 185, 186
See application file for complete search history.

(56) References Cited

U.S. PATENT DOCUMENTS

| | | | |
|---|---|---|---|
| 5,565,817 A * | 10/1996 | Lakshmikumar | 331/57 |
| 5,896,069 A * | 4/1999 | Williams et al. | 331/57 |
| 6,271,730 B1 * | 8/2001 | Abe et al. | 331/34 |
| 6,650,190 B2 * | 11/2003 | Jordan et al. | 331/57 |
| 7,167,056 B2 * | 1/2007 | Fang et al. | 331/57 |
| 2002/0190798 A1 * | 12/2002 | Kozaki | 331/57 |

FOREIGN PATENT DOCUMENTS

| | | |
|---|---|---|
| JP | 2000-315939 | 11/2000 |
| JP | 2002-117671 | 4/2002 |
| JP | 3-866545 | 10/2006 |

OTHER PUBLICATIONS

"A Low-Phase-Noise CMOS Ring Oscillator with differential Control" Lu, et al., ASIC, 2005. ASICON2005. vol. 2. pp. 540-543 Journal of the sixth international conference; Oct. 24-27, 2005.

* cited by examiner

*Primary Examiner* — Joseph Chang
*Assistant Examiner* — Jeffrey Shin
(74) *Attorney, Agent, or Firm* — McGinn IP Law Group, PLLC

(57) ABSTRACT

A voltage-controlled oscillator includes a delay circuit. The delay circuit includes a first buffer inverter which receives one of the differential input signal and outputs an other of the differential output signal, a second buffer inverter which receives the other of the differential input signal and outputs the one of the differential output signal, a first latch inverter which receives the one of the differential output signal, and includes an output connected to an output of the first buffer inverter, and a second latch inverter which receives the other of the differential output signal, and includes an output connected to an output of the second buffer inverter. The first latch inverter and the first buffer inverter receive a current produced from different voltage-current conversion circuits.

8 Claims, 11 Drawing Sheets

VOLTAGE-CONTROLLED OSCILLATOR INCLUDING PLURALITY OF DELAY CELLS

BACKGROUND OF THE INVENTION

1. Field of the Invention

The present invention relates to a voltage-controlled oscillator, and particularly to a voltage-controlled oscillator of a ring oscillator type and a phase-locked loop circuit using the voltage-controlled oscillator.

2. Description of Related Art

A voltage-controlled oscillator (VCO) has been widely used in the fields of communication and digital signal processing. Especially, a voltage-controlled oscillator of a ring oscillator type with a CMOS configuration is often used for an integrated-circuit voltage-controlled oscillator. As the most typical voltage-controlled oscillator of the ring oscillator type, the one as described in Patent Document 1 is well known in which an odd number of stages of CMOS inverters are cascade-connected and an output of the inverter of the last stage is fed back to an input of the inverter of a first stage.

FIG. 1 is a circuit diagram of the voltage-controlled oscillator of the ring oscillator type, disclosed by patent Document 1. In the circuit, a ring oscillator is configured so that an output of a last stage 13 among three stages of CMOS inverter circuits I1, I2 and I3 cascade-connected in series is inputted to the inverter I1 of the first stage. Power is supplied to the ring oscillator from a p-channel MOS current-source transistor P2 and an n-channel MOS current-source transistor N3.

Moreover, in FIG. 1, circuits for respectively supplying first and second reference voltages to gates of the current-source transistors P2 and N3 are described. A gate and a drain of an n-channel MOS transistor N1 are connected to each other, and a first reference voltage signal is generated by a voltage obtained between the gate and a source of the n-channel MOS transistor N1 by feeding a constant current to the transistor N1. Furthermore, a gate and a drain of a p-channel MOS transistor P1 are connected to each other, and a second reference voltage is generated by a voltage obtained between the gate and a source of the p-channel MOS transistor P1 by feeding, to the p-channel MOS transistor P1, a current caused by a current mirror circuit formed of n-channel MOS transistors N1 and N2 to flow through a source and a drain of the n-channel MOS transistor N2. The circuit is known for its capabilities of controlling the first and second reference voltages by changing a current to be fed to the n-channel MOS transistor N1, and thereby of further changing an oscillation frequency of the ring oscillator by controlling a current flowing through current-source transistors P2 and N3.

In addition, a voltage-controlled oscillator is also known in which the CMOS inverters forming the ring oscillator are replaced with differential amplifiers to lower sensitivity to power supply noise, and thus to stabilize process variation. FIG. 2 is a circuit diagram of a voltage-controlled oscillator using differential amplifiers described in Patent Document 2.

The ring oscillators of the CMOS type described in Patent Documents 1 and 2 have an advantage of being able to widely secure frequency characteristics in a relatively small area compared with a voltage-controlled oscillator with an LC configuration. However, they are generally considered to have poorer phase noise characteristics than the voltage-controlled oscillator with the LC configuration.

A voltage-controlled oscillator with a CMOS ring oscillator configuration in which the phase noise characteristics are improved is described in Non-patent Document 1. FIG. 3 is a circuit diagram of a single stage of a delay circuit forming the ring oscillator. The ring oscillator can be formed by cascade-connecting multiple delay circuits and feeding back an output of the last stage of the delay circuit to an input of the first stage thereof.

Delay elements forming the ring oscillator receive one of differential inputs and output one of differential outputs with a first buffer inverter formed of MP21 and MN21, as well as receive the other of the differential inputs and output the other of the differential outputs with a second buffer inverter formed of MP22 and MN22. The power of the first and second buffer inverters is supplied from current sources composed of PMOS transistors MP11 and MP12 and NMOS transistors MN11 and MN12. The currents to be fed through the current sources make it possible to control oscillation frequencies.

Moreover, a latch is formed by an inverter formed of MP31 and MN31 and an inverter formed of MP32 and MN33. The latch allows the first and second buffer inverters to control phases of signals so as to be differential outputs while securing oscillation amplitude. Thereby, the phase noise characteristics and the jitter characteristics are improved.

[Patent Document 1] Japanese Patent Application Publication No. 2002-117671 (FIG. 2)

[Patent Document 2] Japanese Patent Application Publication No. 2000-315939 (FIG. 2)

[Non-patent Document 1] hi-Qiang lu, Feng-Chang Lai and Jian-Guo Ma; "A Low-Phase-Noise CMOS Ring Oscillator with differential Control"; ASIC, 2005. ASICON2005. Vol. 2. pp. 540-543. Journal of the sixth international conference; Oct. 24-27, 2005.

SUMMARY

As described above, the above non-Patent Document 1 exhibits the excellent phase noise characteristics and jitter characteristics as the voltage-controlled oscillator with the CMOS ring oscillator configuration. However, according to the study of the inventor, a buffer inverter needs to have a higher drive capability than a latch inverter due to a circuit configuration thereof. If a current supplied from a current-source transistor is reduced to operate a ring oscillator at a low frequency, the drive capability of the buffer inverter decreases, so that the holding capability of the latch inverter gets higher than the drive capability thereof. As a result, potentials do not invert, and thus the voltage-controlled oscillator does not serve as a ring oscillator. For this reason, the voltage-controlled oscillator of Patent Document 3 is turned out to be unsuitable for an application where oscillation with a wide frequency range is required, such as a wideband PLL.

The invention disclosed in the application generally has the following configuration.

A voltage-controlled oscillator according to an exemplary aspect of the present invention includes a plurality of delay cells cascade connected, each of delay cells receiving a differential signal and outputting a delayed differential signal, a delay time of the delay cells being controlled by a current to be supplied from a voltage-current conversion circuit, a differential output signal of a last stage of the delay cells being fed back as a differential input signal of a first stage of the delay cells so that the differential output signal has a reversed phase with an input of the first stage of the delay cells, in order to produce an oscillation frequencies controlled by applying a voltage to the voltage-current conversion circuit. Each of the plurality of delay cells includes a first buffer inverter which receives one of the differential input signal and outputs an other of the differential output signal, a second buffer inverter which receives the other of the differential input signal and outputs the one of the differential output signal, a first latch inverter which receives the one of the differential output signal, and includes an output connected to an output of the first buffer inverter, and a second latch inverter which receives the other of the differential output signal, and includes an output connected to an output of the second buffer inverter. The first latch inverter and the first buffer inverter receive a current produced from different voltage-current conversion circuits. The second latch inverter and the second buffer inverter receive a current produced from the different voltage-current conversion circus.

The exemplary aspect makes it possible to obtain a voltage-controlled oscillator having excellent phase noise characteristics and jitter characteristics and capable of oscillating in a wide frequency range.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Descriptions will be given of an exemplary embodiment of the present invention based on an exemplary embodiment.

First Exemplary Embodiment

Figure 4:
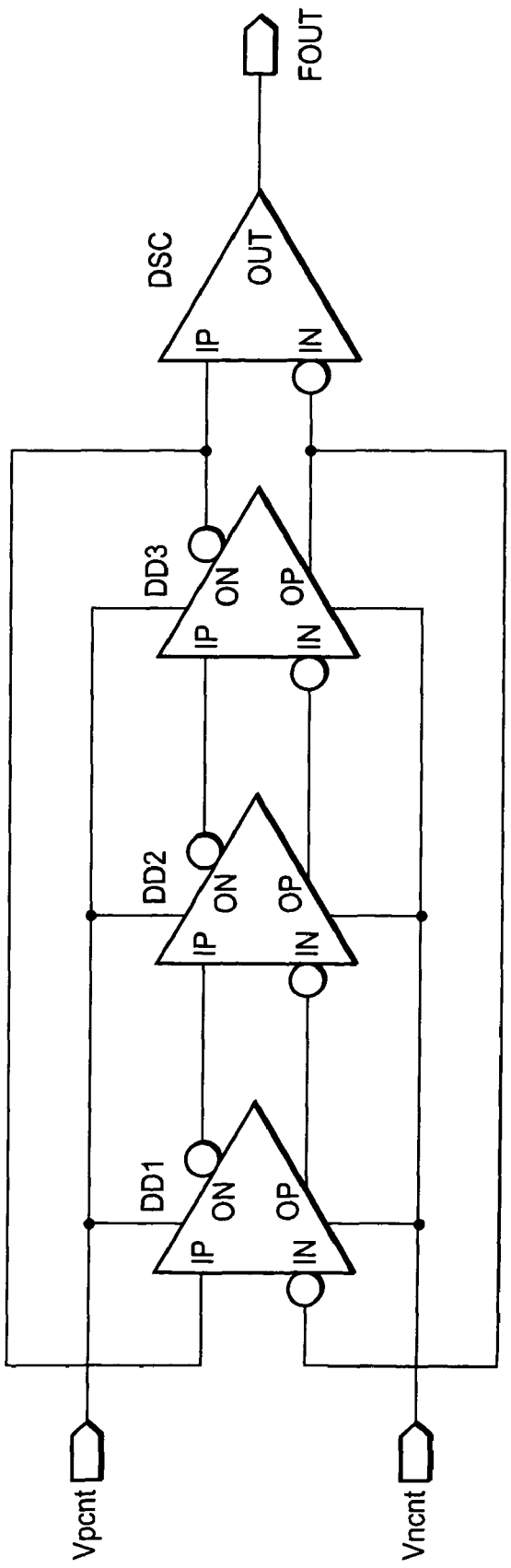
FIG. 4 is a block diagram of an entire voltage-controlled oscillator in an exemplary embodiment of the present invention.

FIG. 4 is a block diagram of an entire voltage-controlled oscillator in an exemplary embodiment of the present invention. Multiple stages of delay cells DD1, DD2 and DD3 that input differential signals and output delayed differential signals are cascade-connected in the voltage-controlled oscillator of the exemplary embodiment. Differential output signals ON and OP of the last stage DD3 are fed back as differential input signals IP and IN of the first stage DD1 so that phases thereof may be reversed with respect to the inputs IP and IN of the first stage.

The input and output of each delay cell have reversed phases to each other. Accordingly, when an odd number of stages of delay cells are cascade-connected, ON and OP of the last stage are connected to IP and IN of the first stage, respectively. Thereby, phases between the differential output signals of the last stage and the differential input signals of the first stage are reversed, thus causing the loop of the delay cells to oscillate. On the other hand, when an even number of stages of delay cells are cascade-connected, ON and OP of the last stage are interchanged with each other and are connected to IN and IP of the first stage, respectively. Thereby, phases between the differential output signals of the last stage and the differential input signals of the first stage are reversed, thus causing the loop of the delay cells to oscillate. In FIG. 4, the delay cells of three stages are cascade-connected; therefore, the number of cascade connection stages is an odd number. Thus, ON and OP of the last stage DD3 is connected to IP and IN of the first stage DD1, respectively. In addition, Vpcnt and Vncnt being first and second reference voltage signals are applied to each of the delay cells DD1 to DD3 to control oscillation frequencies.

Figure 7:
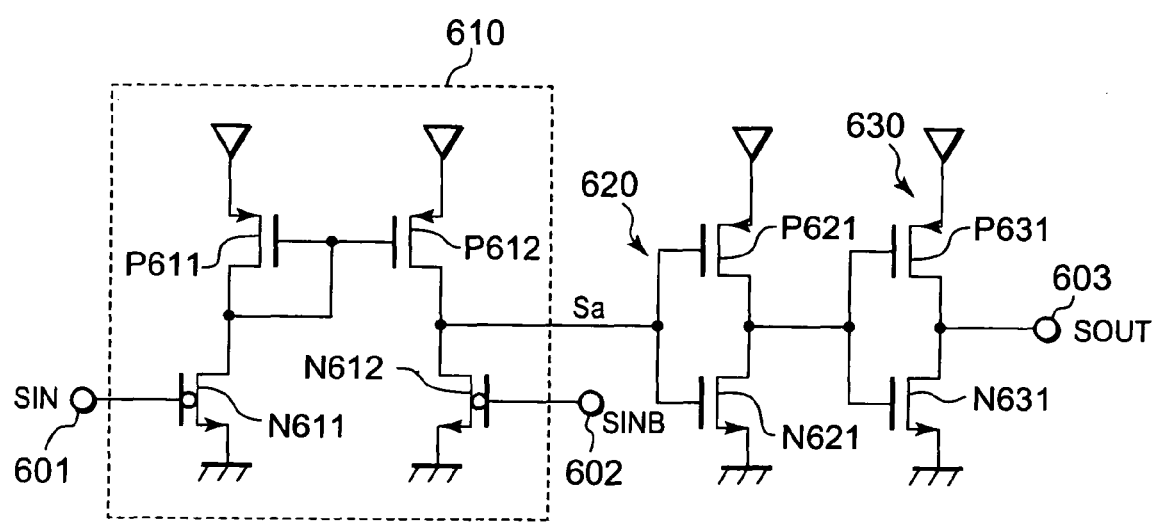
FIG. 7 is a circuit diagram showing an example of a differential single conversion circuit in FIG. 4.

DSC is a differential single conversion circuit, and outputs a single output signal FOUT upon receipt of the differential output signals ON and OP of DD3. A publicly-known circuit can be used as the differential single conversion circuit. As an example, a circuit described in Japanese Patent Application Publication No. 2006-339973 is shown in FIG. 7.

Figure 5:
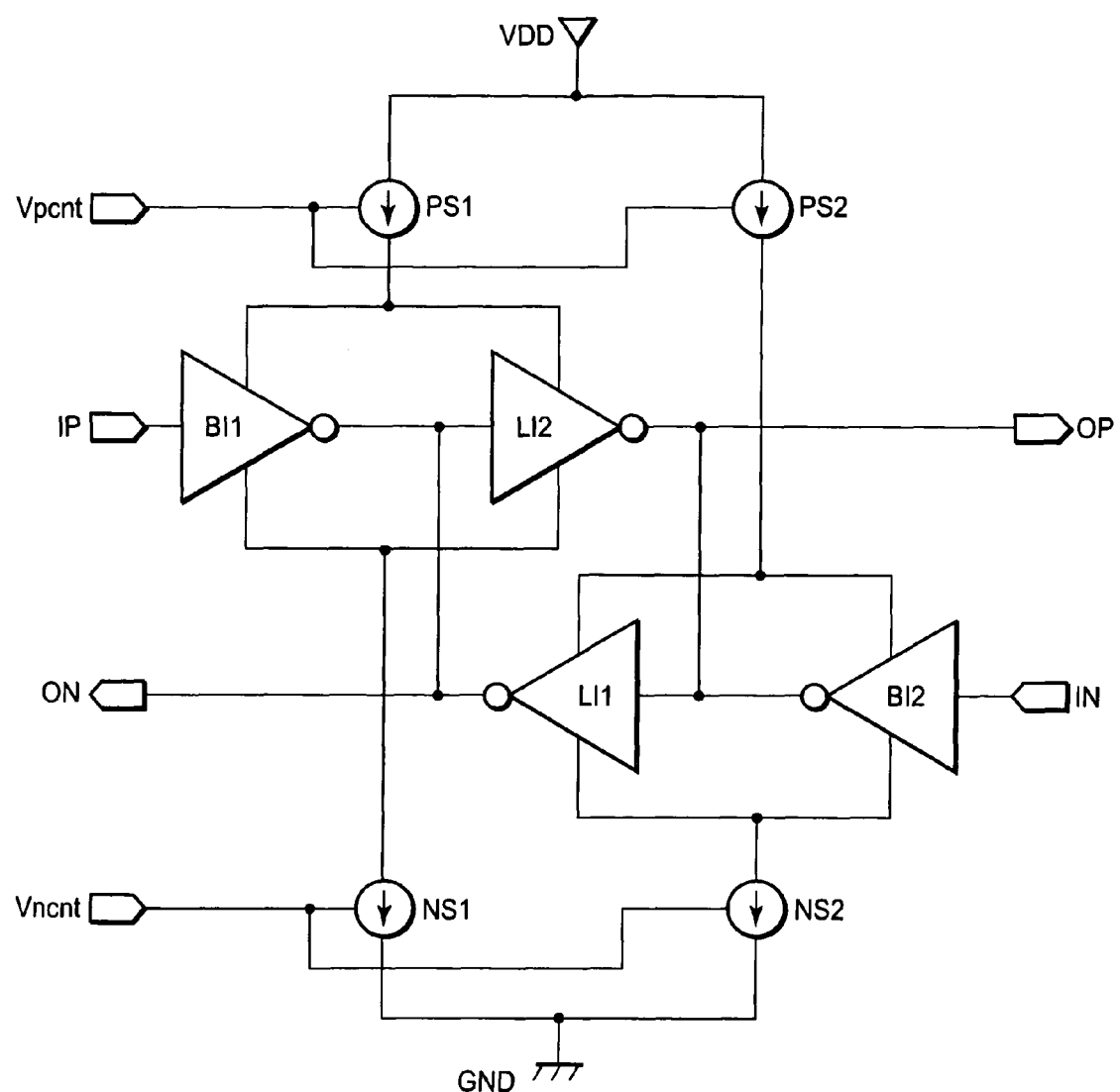
FIG. 5 is a block diagram showing an example of a delay cell in FIG. 4.

Next, descriptions will be given of an internal configuration of each delay cell of the delay cells DD1 to DD3 with reference to a functional block diagram in FIG. 5. The delay cell includes a buffer inverter BI1 that receives the differential input signal IP and outputs the differential output signal ON, a buffer inverter BI2 that receives the differential input signal IN and outputs the differential output signal OP, and a latch circuit formed of latch inverters LI1 and LI2. The latch circuit has a function to cause the differential output signals OP and ON to always hold a reversed state, and also to increase the output amplitudes of the differential output signals OP and ON.

A p-channel side voltage-current conversion circuit PS1 receives the reference voltage signal Vpcnt and supplies a constant current from a positive power supply VDD to the buffer inverter BI1 and the latch inverter LI2. Similarly, a p-channel side voltage-current conversion circuit PS2 receives the reference voltage signal Vpcnt, and supplies a constant current from the positive power supply VDD to the buffer inverter BI2 and the latch inverter LI1.

Next, an n-channel side voltage-current conversion circuit NS1 receives the reference voltage signal Vncont, and feeds the constant current from the buffer inverter BI1 and the latch inverter LI2 to a ground GND. Similarly, an n-channel side voltage-current conversion circuit NS2 receives the reference voltage signal Vncnt, and feeds the constant current from the buffer inverter BI2 and the latch inverter LI1 to the ground GND.

In essence, currents are supplied from the voltage-current conversion circuits to not only the buffer inverters BI1 and BI2 but also the latch inverters LI1 and LI2 forming the latch circuits.

Next, detailed descriptions will be given of a configuration and operations of the delay cell by using FIG. 6 which is an internal circuit diagram showing the internal circuit of the delay cell in more detail. A buffer inverter 13 with a CMOS configuration is formed of a p-channel MOS transistor MP21 and an n-channel MOS transistor MN21 whose gates and sources are connected with each other, respectively. The gates thereof are connected to the differential input signal IP, and the drains thereof are connected in common to be the differential output signal ON.

Similarly, a buffer inverter 14 is formed of a p-channel MOS transistor MP22 and an n-channel MOS transistor MN22 whose gates and sources are connected with each other, respectively. The gates thereof are connected to the differential input signal IN, and the drains thereof are to be the differential output signal OP.

A latch circuit 15 includes a latch inverter formed of a p-channel MOS transistor MP31 and an n-channel MOS transistor MN31, and a latch inverter formed of a p-channel MOS transistor MP32 and an n-channel MOS transistor MN32. The latch circuit is connected between the differential output signals ON and OP, and causes the differential output signals ON and OP to always hold a reversed state.

Power is supplied from a p-channel MOS transistor MP111 whose source is connected to the positive power supply VDD and whose gate is connected to the reference voltage signal Vpcnt, to the p-channel MOS transistor MP21 of the buffer inverter 13 and the p-channel MOS transistor MP32 of the latch circuit. Similarly, power is supplied from a p-channel MOS transistor MP112 whose source is connected to the positive power supply VDD and whose gate is connected to the reference voltage signal Vpcnt, to the p-channel MOS transistor MP22 of the buffer inverter 14 and the p-channel MOS transistor MP31 of the latch circuit.

Further, sources of the n-channel MOS transistor MN21 of the buffer inverter 13 and of the n-channel MOS transistor MN32 of the latch circuit are connected to a drain of an n-channel MOS transistor MN111 whose source is connected to the ground potential GND and whose gate is connected to the reference voltage signal Vncnt. Similarly, sources of the n-channel MOS transistor MN22 of the buffer inverter 14 and of the n-channel MOS transistor MN31 of the latch circuit are connected to a drain of an n-channel MOS transistor MN112 whose source is connected to the ground potential GND and whose gate is connected to the reference voltage signal Vncnt.

Next, descriptions will be given of the operations of the delay cell described in FIG. 6. Assuming that, firstly, the differential input signal IP is at low level and IN is at high level, ON is at high level and OP is at low level. In this state, MP21, MP31, MN22 and MN32 are turned on and MP22, MP32, MN21 and MN31 are turned off to settle into a stable state. At this point, power is supplied from the current-source transistors MP111, MP112, MN112 and MN111 to the transistors MP21, MP31, MN22 and MN32 which are in the ON state, respectively.

In the exemplary embodiment, the delay circuit has the ring configuration of odd stages. Hence, an output signal of the last stage changes after a lapse of delay time determined depending on the number of stages of the ring since an input of the first stage changes, and the output signal is to be inputted to the first stage as a signal of opposite phase. Consequently, the differential input signal IP shifts to the high level and the differential input signal IN shifts to the low level, after the lapse of the predetermined delay time.

Figure 6:
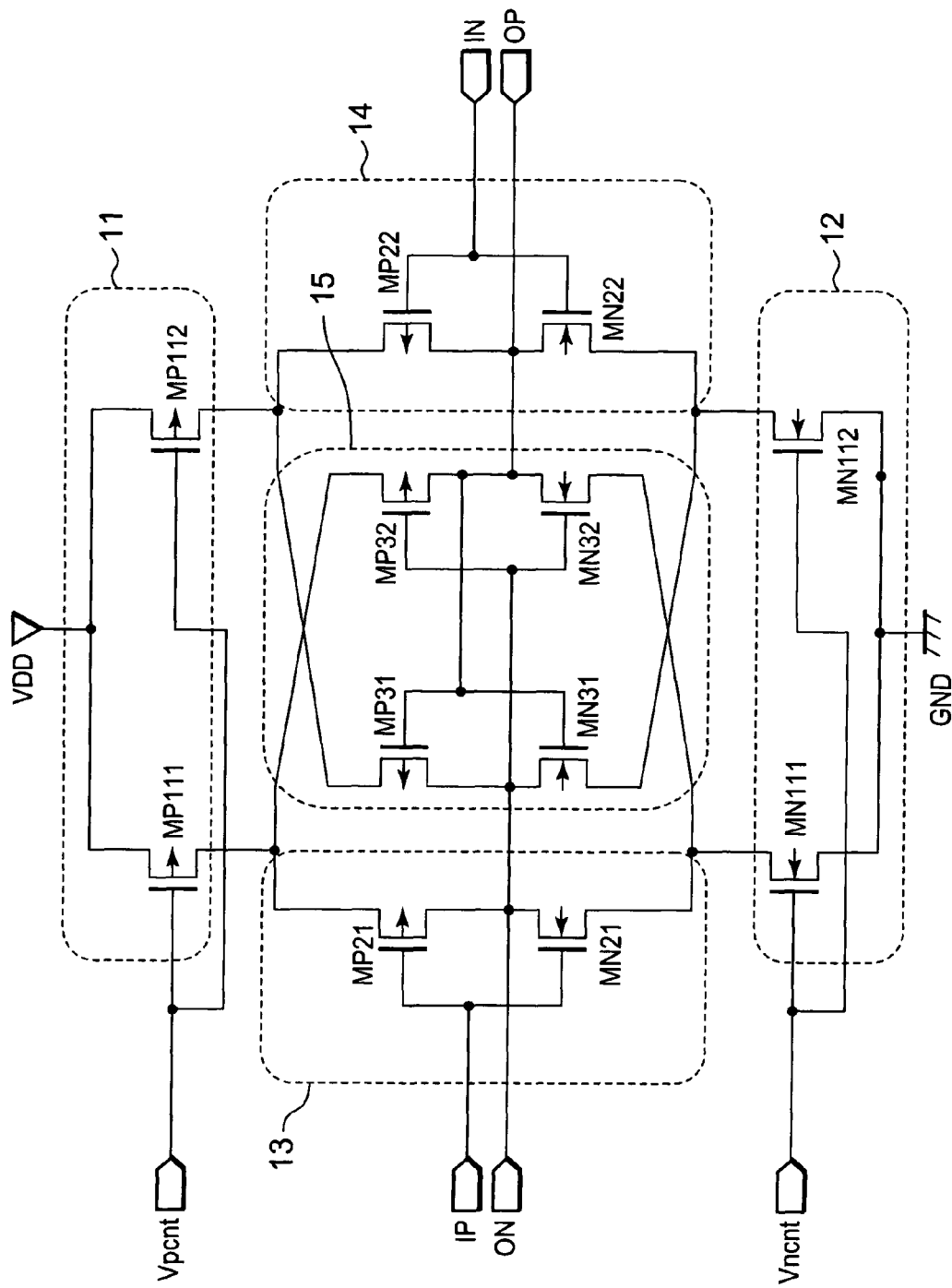
FIG. 6 is a circuit diagram showing an example of the delay cell in FIG. 4.

Here, when focusing on the left half of the circuit in FIG. 6, the differential input signal IP gradually shifts from the low level to the high level, so that current also starts to flow through the n-channel transistor MN21 when the differential input signal IP reaches the threshold voltage of MN21 or larger. However, the p-channel transistor MP31 still holds the previous state at this point, and is in the ON state.

Therefore, through current flows from MP21 and MP31 to MN21. Here, the output voltage ON is determined depending on a difference in the capability of each transistor. With the shift of the input, an impedance of MP21 increases and that of MN21 decreases. A transistor with a lower drive capability than the buffer inverter is used for MP31 being a transistor of the latch circuit; therefore, the impedance thereof is high. As a result, the output voltage ON comes closer to that on the ground side where a transistor with low impedance is used, and thus the potential of the output voltage ON decreases.

Similarly, since the right half of the circuit operates in the same way, the output voltage OP shifts to the power supply side. The output voltages ON and OP move to sides opposite to those of the original initial values thereof, respectively. When the output voltages ON and OP exceed the logic threshold values of the inverters forming the internal latch, the potential of the latch circuit inverts, and the output voltages ON and OP completely invert accordingly.

The inversion operation of the internal latch circuit is an action of positive feedback from the external buffer inverter point of view, and supports the shift of a signal. The above operations make it possible to operate inversely while holding a differential state and to obtain a differential output.

Here, considering conditions that enable the above-mentioned inversion operation of the output signals ON and OP in association with the changes of the input signals IP and IN, focus is put on the fact that the output signals must reach the logic threshold values of the latch circuit 15 when the input signals shift. If the condition is not satisfied, then the logic state of the latch circuit 15 does not shift; therefore, the logic of the output signals ON and OP does not invert, thus causing the stop of the oscillation.

From this viewpoint, the circuit (FIG. 3) described in Non-patent Document 1 has a configuration in which the latch circuit (MP31, MP32, MN31 and MN32) is directly connected to the power supply VDD or the ground GND; therefore, if the voltage values between VDD and Vpcnt and between Vncnt and GND, which control the oscillation frequencies, start falling, the latch inverter (MP31 and MN31, or MP32 and MN32) has lower impedance than that of the buffer inverter (MP21 and MN21, or MP22 and MN22) in some cases. In this case, the output nodes ON and OP may not reach the logic threshold value of the latch circuit (MP31, MP32, MN31 and MN32). This leads to the stop of the oscillation. Thus, if the voltage value between VDD and Vpcnt or between Vncnt and GND is decreased with intent to oscillate the oscillator at a low frequency, then the oscillation stops since it falls below the oscillation limit absolute value of the ring oscillator. Consequently, it is not possible to oscillate at a low frequency. Hence, it is difficult to secure the oscillation in a wide frequency range.

On the other hand, in the above-mentioned exemplary embodiment (FIG. 6) of the present invention, current is supplied to the latch circuit 15 as well as the buffer inverters 13 and 14 by current sources (voltage-current conversion circuits) 11 and 12 under control. This prevents an interchange of impedance ratios between the latch circuit 15 and the buffer inverters 13 and 14. This makes it possible to invert the latch circuit 15 with the buffer inverters 13 and 14 even in a low frequency range. As a result, it is possible to obtain a wide range of output oscillation frequencies while maintaining a differential signal.

Figure 3:
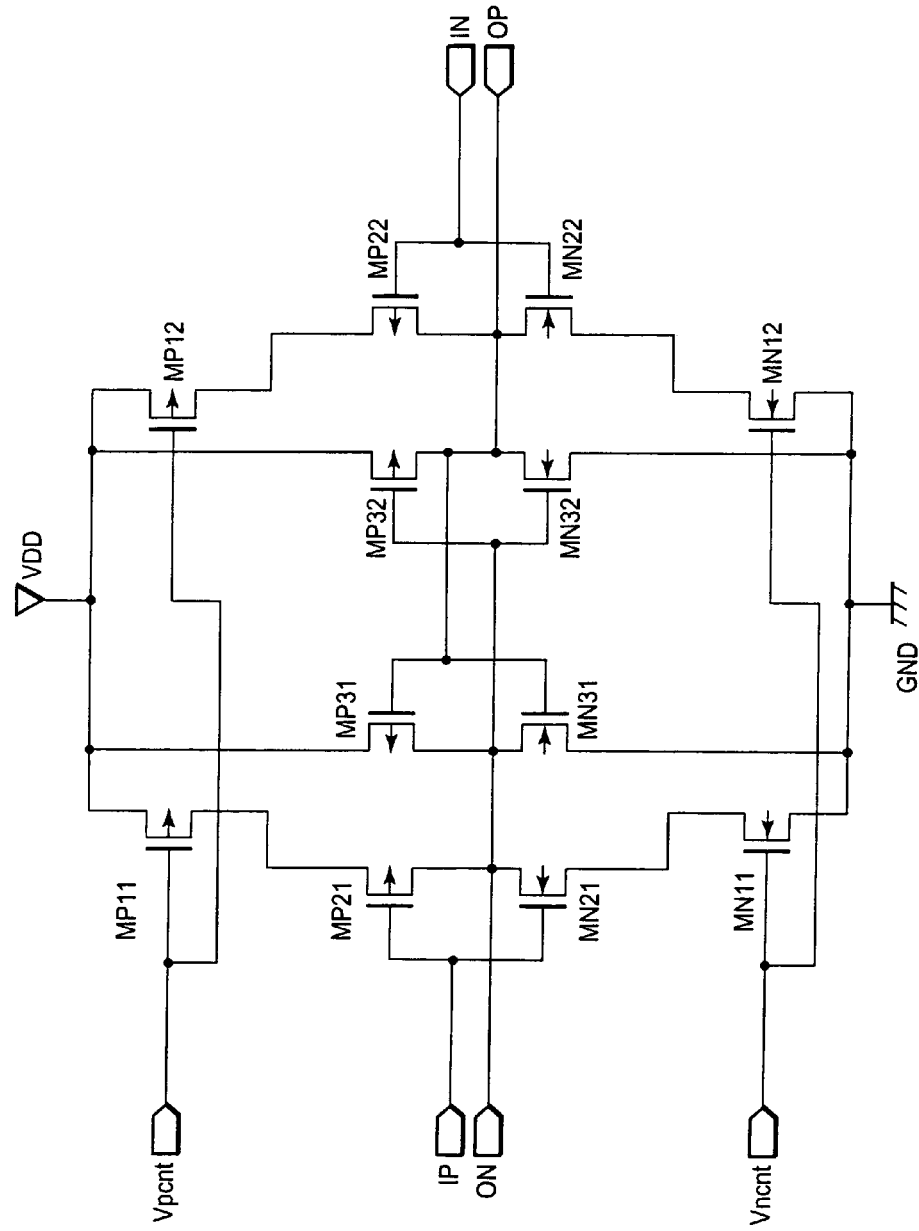
FIG. 3 is a circuit diagram of a delay cell in a voltage-controlled oscillator of a differential latch type described in Non-patent Document 1.
Figure 8:
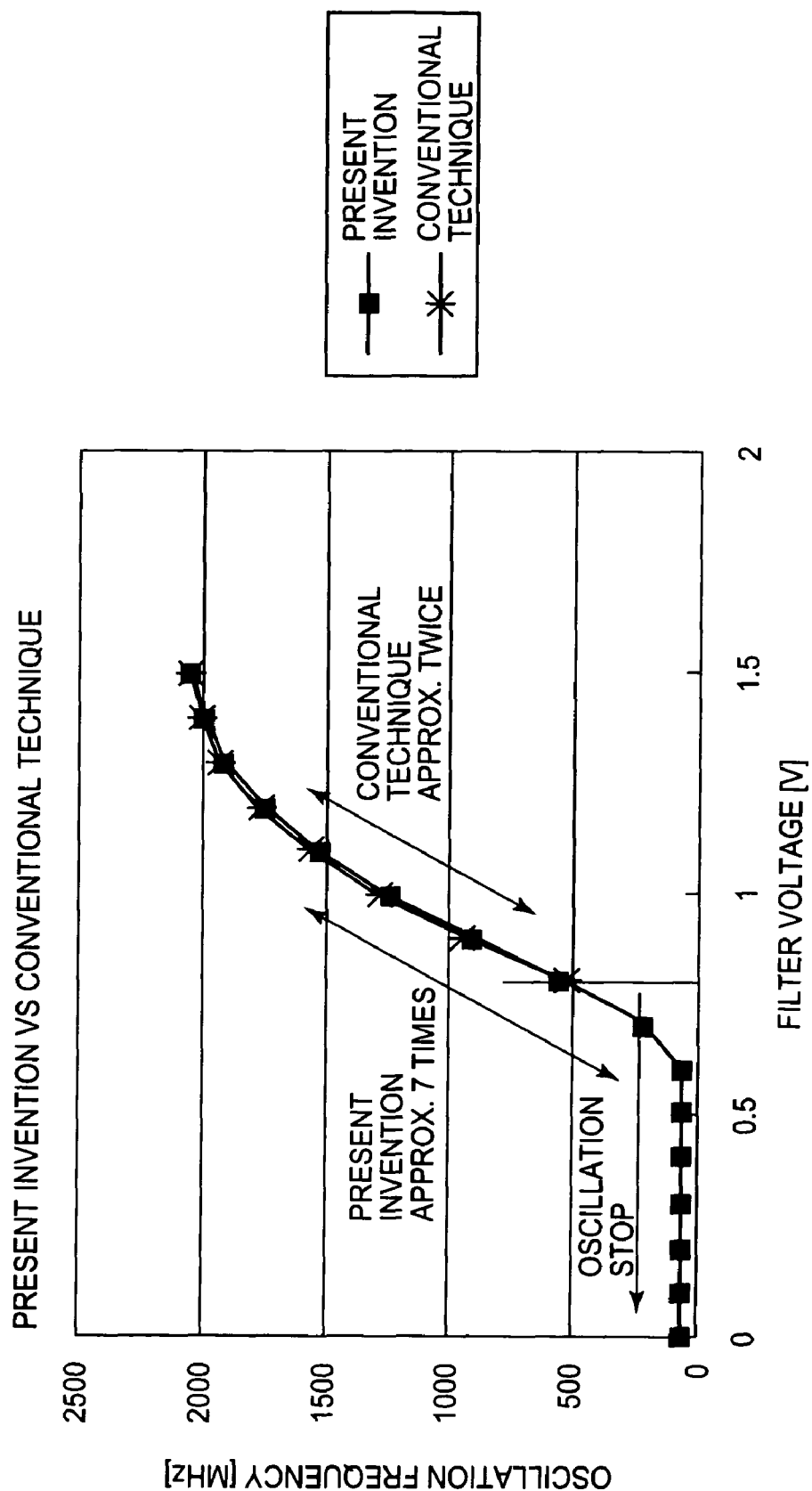
FIG. 8 is a view comparing oscillation frequency ranges of the technique (Non-patent Document 1) and the exemplary embodiment described in FIG. 6.

Here, FIG. 8 shows a comparison result of the oscillation frequency ranges between the technique described in Non-patent Document 1 of FIG. 3 and the voltage-controlled oscillator using the delay cell described in FIG. 6 being the exemplary embodiment of the present invention. The horizontal axis in the drawing indicates a filter voltage which is the source of the reference voltage signal (Vpcnt or Vncnt) to be provided to the delay cell, and the vertical axis indicates an oscillation frequency range. The upper limit of an oscillation frequency is approximately 1,500 MHz in both the conventional example and the exemplary embodiment of the present invention, and there is substantially no difference. However, it has been confirmed that the oscillation frequency of the related example should be 500 MHz or higher to operate while it is possible to operate even at a further lower frequency of several tens of MHz in the exemplary embodiment of the present invention.

Figure 9:
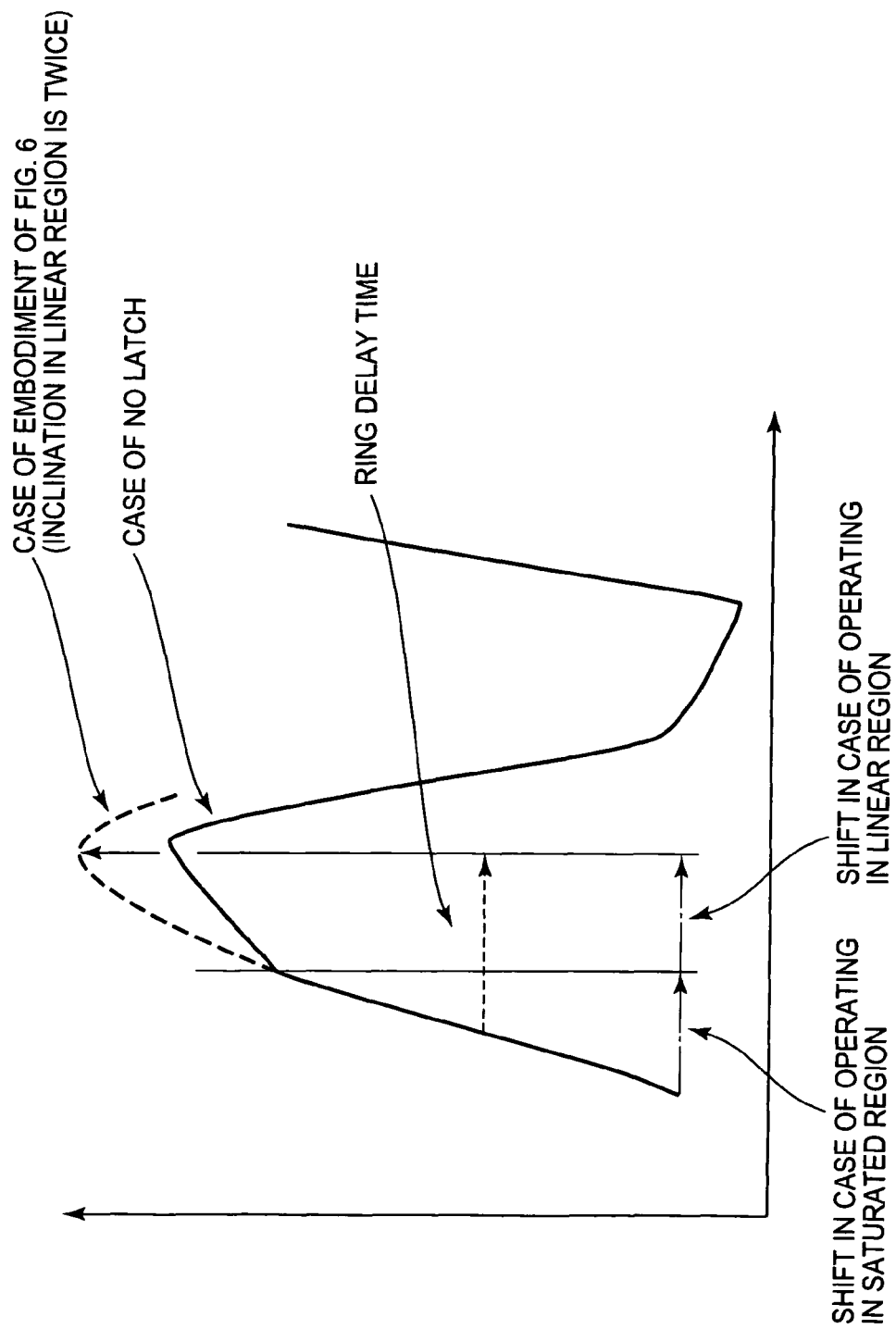
FIG. 9 is a view for explaining an effect of providing a latch circuit and separately providing current sources in FIG. 6.

Next, descriptions will be given of an effect of providing the latch circuit 15, and further of separately providing current-source transistors (MP111, MP112, MN111 or MN112) for the buffer inverter (for example, 13) and the latch inverter (for example, MP31 and MN31) whose drains are connected to the same output (for example, ON), with reference to FIG. 9. The effect can be obtained with the following reason. Firstly, consideration is given to a state where no internal latch is provided, that is, to an inverter circuit controlled by a current source, such as the buffer inverter 13 without the internal latch 15 in FIG. 6. Since there is no internal latch, it is natural that holding a differential should be impossible. Further, the oscillation amplitude decreases in some cases. This is because of the following reason. At the shift of a signal, the buffer inverter 13 feeds a current controlled by the top and bottom current sources (MP111 and MN111). In the case of this configuration, when the output potential comes close to the power supply/ground to a certain extent, a voltage Vds between the source and the drain of the current-source transistor MP11 or MN111 is compressed by the change and, ultimately, the current source transistor MP111 or MN111 operates in a linear region and comes to feed a minute current only. Accordingly, the output potential changes sharply to a certain point, and gradually shifts toward the power supply or the ground afterwards. If the delay time caused by going around the ring of a ring oscillator is shorter than a time required for the shift to reach the power supply or the ground, then the oscillation amplitude does not reach the power supply or the ground, and thus only small amplitude is conducted. The solid line in FIG. 9 shows a waveform of the output signal ON especially in a case where the input signal IP changes from the high level to the low level.

In contrast, considering operations of a case where the latch circuit 15 is provided as in FIG. 6, and current-source transistors are provided separately for a buffer inverter and a latch inverter whose drains are connected to the same output, the operations are the same as the case where the latch circuit 15 is not provided, until a state where the output potential shifts to a certain extent. However, when the output potential shifts to the certain extent, the latch circuit 15 inverts, and thus the positive feedback is given to the output. Accordingly, the latch circuit 15 allows a current from another current-source transistor (MP112 or MN112) to be fed in a region where the current-source transistor MP111 or MN111 operates linearly, thereby allowing the output potential to shift to the power ground at higher speed. The solid line in FIG. 9 shows the waveform of the output signal ON especially in the case where the input signal IP changes from the high level to the low level. This makes it possible to largely secure the amplitude level, and to achieve better phase noise characteristics and better jitter characteristics. Especially, this effect can be obtained by providing current-sources separately for a buffer inverter and a latch inverter whose drains are connected in common.

In other words, power is supplied to the internal latch 15 from a current source different from that for a buffer inverter whose drains are connected in common. Since the buffer inverters 13 and 14 receive the differential signal inputs IP and IN, the current sources operate in a complementary manner, respectively. Specifically, in order to supply current, MN112 operates during operation of MP111, and MN111 operates during operation of MP112. Hence, when MP111 is supplying current, MP112 does not substantially supply current. Consequently, MP112 can feed current through the latch circuit 15, and thus there is no need to place a current source specially for the latch 15.

Figure 10:
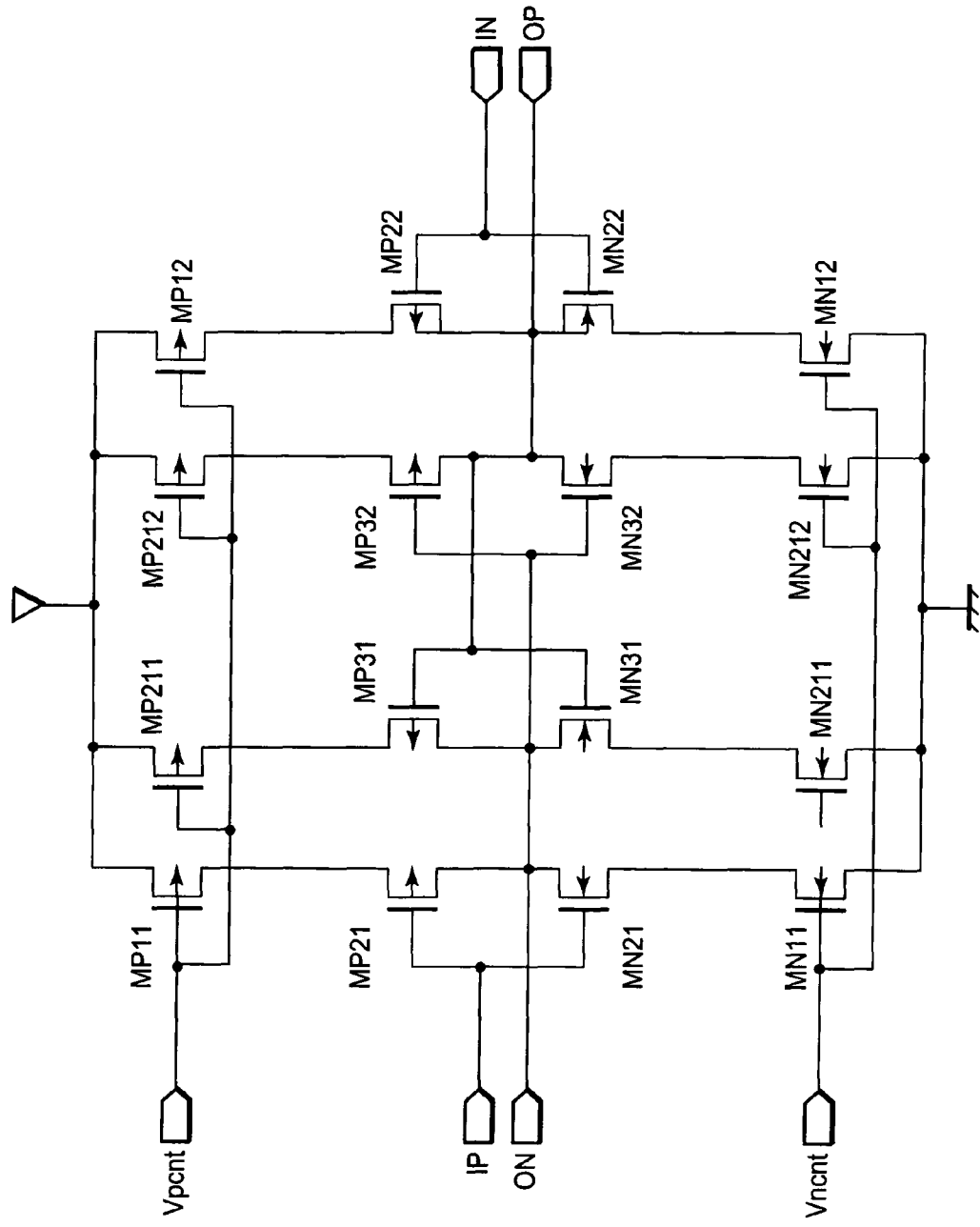
FIG. 10 is a circuit diagram showing another configuration example of the delay cell in FIG. 4.

However, if there are no constraints on a layout and current consumption, then it is possible to further improve the characteristics of the linear region and to obtain an oscillation waveform with good phase noise characteristics and a wide oscillation range by providing a current source specially for an internal latch and adjusting a current capability thereof. A circuit diagram of the delay cell is shown in FIG. 10. In FIG. 10, a current-source transistor is provided individually for each of a buffer inverter and a latch inverter.

Figure 11:
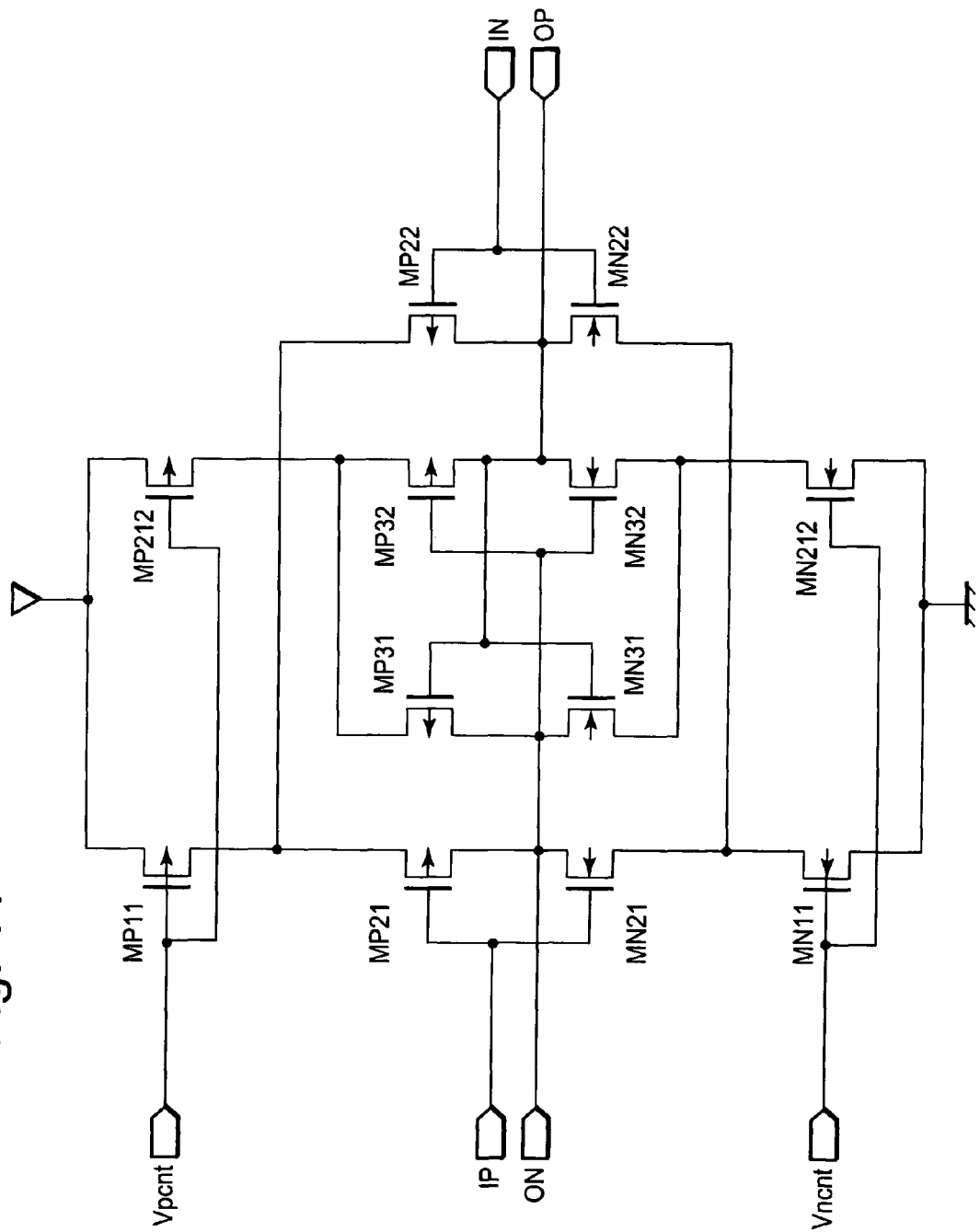
FIG. 11 is a circuit diagram showing still another configuration example of the delay cell in FIG. 4.

Moreover, it is also possible to share current-source transistors respectively for two buffer inverters and two latch inverters, which configure one delay cell, as shown in FIG. 11. Any of the above FIGS. 6, 10 and 11 are common in a point of providing current sources separately for the buffer inverter and the latch inverter, whose drains are connected in common.

Figure 12:
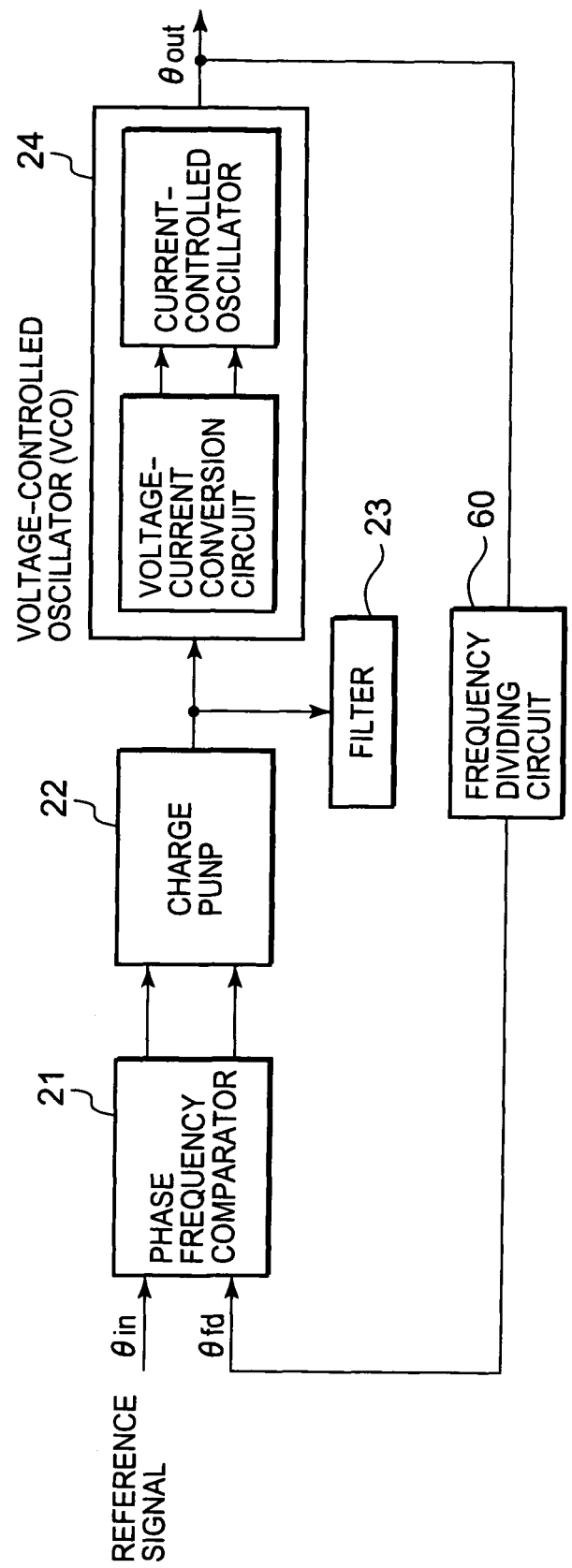
FIG. 12 is a block diagram of a PLL circuit using the voltage-controlled oscillator according to the present invention.

Next, FIG. 12 is a block diagram of a PLL (phase-locked loop) circuit using the voltage-controlled oscillator of the above exemplary embodiment of the present invention. In FIG. 12, it is possible to use known circuits except for a voltage-controlled oscillator 24. A phase frequency comparator receives a reference signal θin inputted from the outside and a feedback clock signal θfd outputted by a frequency dividing circuit 25, and outputs a phase difference signal to a charge pump circuit 22 in accordance with the phase difference. The charge pump circuit 22 charges and discharges a capacitor included in a filter 23 upon reception of the phase difference signal outputted by a phase frequency comparator 21. The filter circuit 23 smoothes a current charged and discharged by the charge pump 22, and provides a reference voltage to the voltage-controlled oscillator (VCO) 24. The voltage-controlled oscillator (VCO) 24 controls the current of the voltage-controlled oscillator based on the reference voltage being the output of the filter 23, and outputs a desired oscillation frequency. The frequency dividing circuit 25 can be provided as required, and outputs the feedback clock signal θfd by decreasing the frequency of a clock generated by the voltage-controlled oscillator (VCO) 24.

Figure 1:
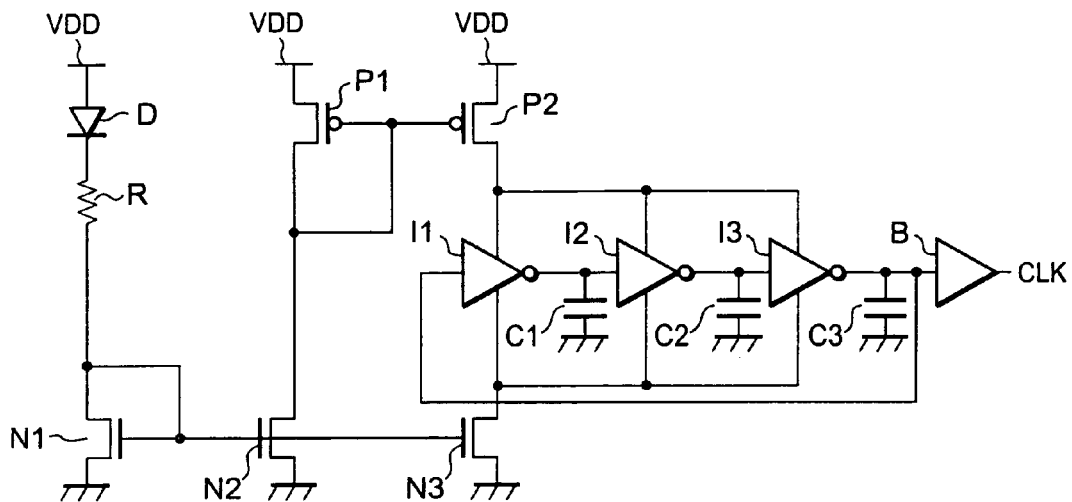
FIG. 1 is a circuit diagram of a ring oscillator of a CMOS inverter type described in Patent Document 1.
Figure 2:
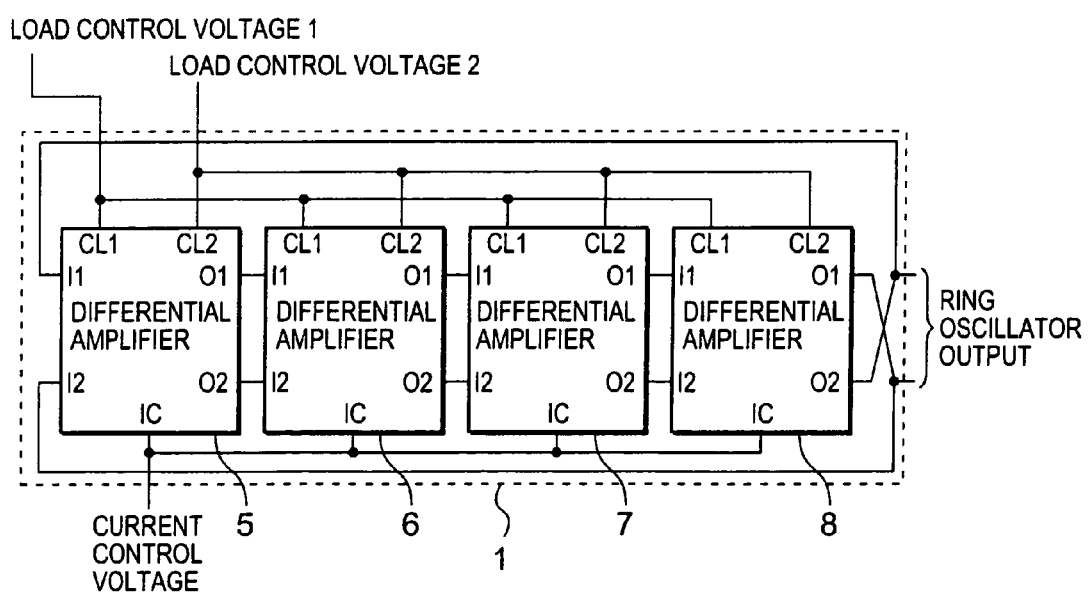
FIG. 2 is a circuit diagram of a voltage-controlled oscillator of a complete differential type described in Patent Document 2.

Note that a voltage-current conversion circuit of the voltage-controlled oscillator (VCO) 24 may be one corresponding to the p-channel side voltage-current conversion circuit 11 or the n-channel side voltage-current conversion circuit 12 in FIG. 6, for example. Further, the voltage-controlled oscillator may be one corresponding to the buffer inverter 13 or 14, or the latch circuit 15 in FIG. 6. Furthermore, with regard to the reference voltage signals Vpcnt and Vncnt, one of the reference voltage signals can easily be generated by a known circuit using a current mirror circuit described in FIG. 1 from the other reference voltage signal.

Although having been described in accordance with the above exemplary embodiment, the present invention is not limited to the configurations of the above exemplary embodiment, and naturally includes various changes and modifications that can be made by those skilled in the art within the scope of the present invention. For example, although voltage-current conversion circuits are provided for both of the p-channel side and the n-channel side in the above exemplary embodiment, it is also possible to provide a voltage-current conversion circuit only to one of sides as required and to directly connect the other to the power supply and the ground.

Further, it is noted that Applicant's intent is to encompass equivalents of all claim elements, even if amended later during prosecution.

What is claimed is:

1. A voltage-controlled oscillator, comprising:
a plurality of delay cells cascade connected, each of the delay cells receiving a differential input signal and outputting a delayed differential output signal, a delay time of the delay cells being controlled by a current to be supplied from a voltage-current conversion circuit, a differential output signal of a last stage of the delay cells being fed back as a differential input signal of a first stage of the delay cells so that the differential output signal has a reversed phase with an input of the first stage of the delay cells, in order to produce an oscillation frequency controlled by applying a voltage to the voltage-current conversion circuit, wherein
each of the plurality of delay cells includes:
a first buffer inverter which receives one of the differential input signal and outputs an other of the differential output signal;
a second buffer inverter which receives an other of the differential input signal and outputs one of the differential output signal;
a first latch inverter which receives the one of the differential output signal, and includes an output connected to an output of the first buffer inverter; and
a second latch inverter which receives the other of the differential output signal, and includes an output connected to an output of the second buffer inverter,
wherein the first latch inverter and the first buffer inverter receive a current produced from different voltage-current conversion circuits; and
wherein each of the plurality of delay cells includes:
a first voltage-current conversion circuit which supplies a first current to the first buffer inverter;
a second voltage-current conversion circuit which supplies a second current to the second buffer inverter;
a third voltage-current conversion circuit which supplies a third current to the first latch inverter; and
a fourth voltage-current conversion circuit which supplies a fourth current to the second latch inverter.

2. The voltage-controlled oscillator according to claim 1, wherein the first to fourth voltage-current conversion circuits comprise:
a first current-source transistor of a first conductivity type, including a source connected to a first power supply node, a gate connected to a first reference voltage node, and a drain connected to the first buffer inverter;
a second current-source transistor of a second conductivity type, including a source connected to a second power supply node, a gate connected to the second reference voltage node, and a drain connected to a source of the first buffer inverter;
a third current-source transistor of the first conductivity type, including a source connected to the first power supply node, a gate connected to the first reference voltage node, and a drain connected to the second buffer inverter;
a fourth current-source transistor of the second conductivity type, including a source connected to the second power supply node, a gate connected to the second reference voltage node, and a drain connected to the second buffer inverter;
a fifth current-source transistor of the first conductivity type, including a source connected to the first power supply node, a gate connected to the first reference voltage node, and a drain connected to the first latch inverter;
a sixth current-source transistor of the second conductivity type, including a source connected to the second power supply node, a gate connected to the second reference voltage node, and a drain connected to the first latch inverter;
a seventh current-source transistor of the first conductivity type, including a source connected to the first power supply node, a gate connected to the first reference voltage node, and a drain connected to the second latch inverter; and
an eighth current-source transistor of the second conductivity type, including a source connected to the second power supply node, a gate connected to the second reference voltage node, and a drain connected to the second latch inverter.

3. A voltage-controlled oscillator, comprising:
a plurality of delay cells cascade connected, each of the delay cells receiving a differential input signal and outputting a delayed differential output signal, a delay time of the delay cells being controlled by a current to be supplied from a voltage-current conversion circuit, a differential output signal of a last stage of the delay cells being fed back as a differential input signal of a first stage of the delay cells so that the differential output signal has a reversed phase with an input of the first stage of the delay cells, in order to produce an oscillation frequency controlled by applying a voltage to the voltage-current conversion circuit, wherein
each of the plurality of delay cells includes:
a first buffer inverter which receives one of the differential input signal and outputs an other of the differential output signal;
a second buffer inverter which receives an other of the differential input signal and outputs one of the differential output signal;
a first latch inverter which receives the one of the differential output signal, and includes an output connected to an output of the first buffer inverter; and
a second latch inverter which receives the other of the differential output signal, and includes an output connected to an output of the second buffer inverter,
wherein the first latch inverter and the first buffer inverter receive a current produced from different voltage-current conversion circuits, and
wherein each of the plurality of delay cells includes:
a first voltage-current conversion circuit which supplies a first current to the first and second buffer inverters; and
a second voltage-current conversion circuit supplying a second current to the first and second latch inverters.

4. The voltage-controlled oscillator according to claim 3, wherein the first and second voltage-current conversion circuits comprise:
a first current-source transistor of a first conductivity type, including a source connected to a first power supply node, a gate connected to a first reference voltage node, and a drain connected to sources of the first and second buffer inverters;
a second current-source transistor of a second conductivity type, including a source connected to a second power supply node, a gate connected to a second reference voltage node, and a drain connected to the first and second buffer inverters;

a third current-source transistor of the first conductivity type, including a source connected to the first power supply node, a gate connected to the first reference voltage node, and a drain connected to the first and second latch inverters; and a fourth current-source transistor of the second conductivity type, including a source connected to the second power supply node, a gate connected to a second reference voltage node, and a drain connected to the first and second latch inverters.

5. A voltage-controlled oscillator including a plurality of delay cells, connected in series, each of the plurality of delay cells comprising:

a first buffer inverter which receives a differential input signal and outputs a differential output signal;

a second buffer inverter which receives an other of the differential input signal and outputs one of the differential output signal;

a first latch inverter which receives the one of the differential output signal, and includes an output connected to an output of the first buffer inverter; and a second latch inverter which receives the differential output signal, and includes an output connected to an output of the second buffer inverter, a first voltage-current conversion circuit which outputs a first current to apply the first current to the first latch inverter; and a second voltage-current conversion circuit which outputs a second current to apply the second current to the first buffer inverter;

said delay cells further comprising:

a third voltage-current conversion circuit which outputs a third current to apply the third current to the second latch inverter; and a fourth voltage-current conversion circuit which outputs a fourth current to apply the fourth current to the second buffer inverter.

6. The voltage-controlled oscillator as claimed in claim 5, wherein the first and second voltage-current conversion circuits include a common first transistor, and the third and fourth voltage-current conversion circuits include a common second transistor.

7. The voltage-controlled oscillator as claimed in claim 5, wherein the first to fourth voltage-current conversion circuits include first to fourth transistors, respectively.

8. The voltage-controlled oscillator as claimed in claim 5, wherein the first and third voltage-current conversion circuits include a common first transistor, and the second and fourth voltage-current conversion circuits include a common second transistor.

* * * * *